United States Patent [19]
Watson

[11] Patent Number: 6,163,559
[45] Date of Patent: Dec. 19, 2000

[54] BEAM EXPANDER FOR ULTRAVIOLET LASERS

[75] Inventor: Tom A. Watson, Carlsbad, Calif.

[73] Assignee: Cymer, Inc., San Diego, Calif.

[21] Appl. No.: 09/102,241

[22] Filed: Jun. 22, 1998

[51] Int. Cl.[7] .............................. H01S 3/098; H01S 3/22; H01S 3/08

[52] U.S. Cl. ................................ 372/102; 372/19; 372/57

[58] Field of Search ................................ 372/102, 57, 19; 359/846, 859, 853, 848, 849, 615

[56] References Cited

U.S. PATENT DOCUMENTS

| | | | |
|---|---|---|---|
| 3,953,667 | 4/1976 | Layton et al. ............................. | 178/6 |
| 4,690,559 | 9/1987 | Florek et al. ............................ | 356/328 |
| 5,343,326 | 8/1994 | Ossman et al. ......................... | 359/216 |
| 5,970,082 | 10/1999 | Ershov ................................... | 372/102 |
| 5,978,394 | 11/1999 | Newman et al. ........................ | 372/32 |

OTHER PUBLICATIONS

McKee, *Canadian Journal of Physics*, vol. 63 (1985).
*Laser Handbook*, vol. 5, North–Holland Press, pp. 45–46 (1985).

*Primary Examiner*—Frank G. Font
*Assistant Examiner*—Armando Rodriguez
*Attorney, Agent, or Firm*—John R. Ross, Esq.

[57] ABSTRACT

A line narrowed ultraviolet laser having a line narrowing system which includes a grating and an all reflective beam expander. In a preferred embodiment, the beam expander consists of a relatively small circular cylindrical mirror and relatively larger elliptical cylindrical mirror and the grating is an eschelle grating mounted in a Littrow configuration.

18 Claims, 6 Drawing Sheets

BEAM EXPANDER FOR ULTRAVIOLET LASERS

This invention relates to laser beam expanders and in particular such beam expanders used for line narrowing ultraviolet lasers.

BACKGROUND OF THE INVENTION

The natural band width of many ultraviolet lasers is relatively wide. For example, the spectral width of an argon fluoride excimer laser is approximately 500 pm (FWHM). One of the important uses of the ArF laser is for integrated circuit lithography in which case the beam is preferably line narrowed such that 95 percent of the beam energy is spread over a spectrum only about 1 pm.

Well known methods for line narrowing ultraviolet lasers such as excimer lasers have been well known for several years. For example, see, McKee, Terrence, Canadian Journal of Physics 1985, Vol. 63 and Laser Handbook, North-Holland Press, pages 45 and 46. These methods typically involve radially spreading the spectrum with one or more prisms or with a grating and selecting a desired spectral range by limiting the beam with an aperture. When a grating is used, the efficiency of the grating is generally increased by expanding the beam upstream of the grating and shrinking it downstream of the grating as shown in FIGS. 1A and 1B which have been extracted from the above two references.

Known method for expanding (and shrinking) the beam in a single direction include the use of one or more prisms as shown in FIG. 1A and at least two cylindrical lenses as shown in FIG. 1B.

Lenses and prisms work well as beam expanders for visible light and relatively long wavelength ultraviolet beams. However, for short wavelength ultraviolet beams, very few materials are available which are sufficiently transparent to the light. When lenses or prisms not having perfect transparency are used to line narrow a high energy beam significant heating of the optic can occur, which can produce unwanted distortions of the optical properties of the beam. This problem is expected to become more severe as photolithographic laser requirements move toward shorter wavelengths and higher output powers.

It is known that mirrors are typically less prone to produce thermal distortion than lenses and prisms, however, Applicant is not aware of any successful prior art that attempts to use mirrors for laser beam expansion for line narrowing system.

What is needed is a better beam expander for line narrowing short wavelength (<200 nm) lasers which can handle high energy beams without distortion.

SUMMARY OF THE INVENTION

The present invention provides a line narrowed ultraviolet laser having a line narrowing system which includes a grating and an all reflective beam expander. In a preferred embodiment, the beam expander consists of a relatively small circular cylindrical mirror and relatively larger elliptical cylindrical mirror and the grating is an eclielle grating mounted in a Littrow configuration. Other mirror combinations are also disclosed.

DETAILED DESCRIPTION OF PREFERRED EMBODIMENTS

First Preferred Embodiment

Figure 1A:
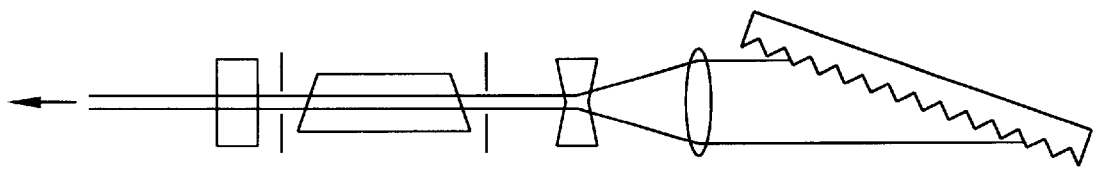
FIGS. 1A and 1B show prior art line narrowing configurations.
Figure 1B:
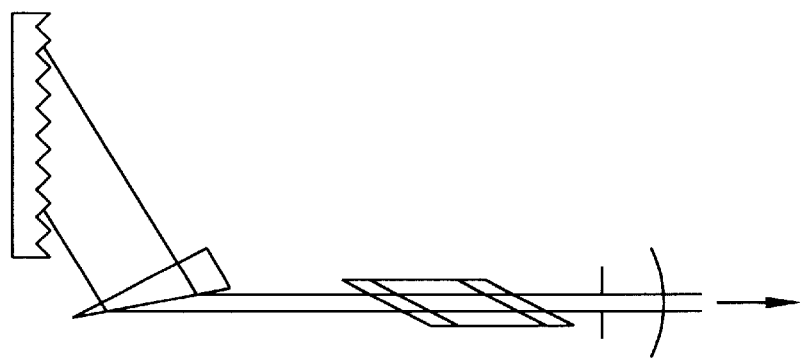
Figure 2:
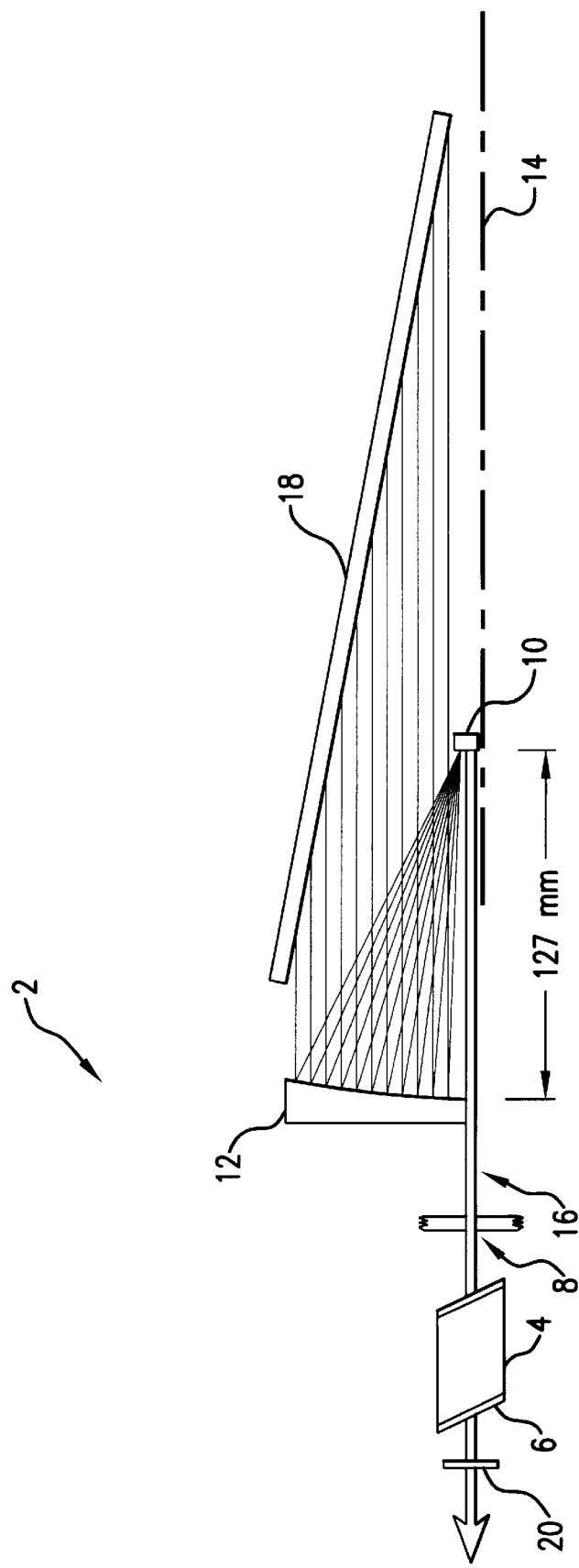
FIG. 2 shows a first embodiment of the present invention.
Figure 3B:
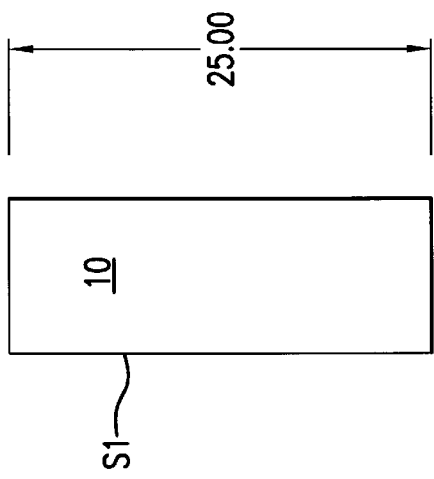
FIGS. 3A and 3B are two views of a circular cylindrical mirror.

A preferred embodiment of the present invention is shown in FIG. 2. This drawing shows the principal optical element of a line narrowed argon fluoride excimer laser system 2. The system includes argon fluoride laser chamber 4. With Brewster or approximately Brewster windows 6 which produces excimer lasing between elongated electrodes (not shown) spaced vertically about 22 mm apart. The beam cross section of about 2.2 mm×20 mm is defined by aperture 8. The beam is reflected first from convex circular cylindrical mirror 10 shown in detail in FIGS. 3A and 3B. Mirror 10 is 25 mm high having a convex surface S1 with cylindrical radius of 13.113 mm.

Figure 4B:
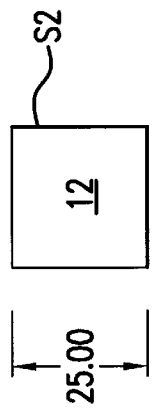
FIGS. 4A and 4B are two views of an almost circular, elliptical cylindrical mirror.
Figure 4A:
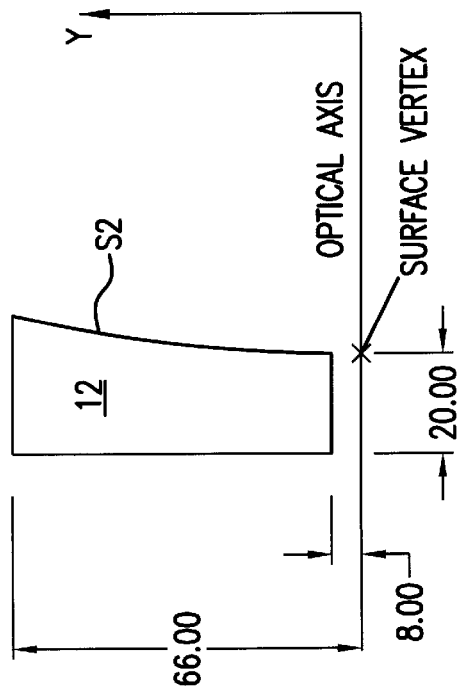

The beam reflected from mirror 10 fans out toward elliptical cylindrical mirror 12 which is shown in detail in FIGS. 4A and 4B. The curved cylindrical surface S2 of mirror 12 is close to that of a cylindrical circular surface having a radius of 271.050 mm but is slightly more concave than a 271.050 mm cylindrical circular surface. The mirror is 58.00 mm wide. A first edge of the mirror is 8.00 mm from the optical axis of the mirror which is aligned with the optical axis of mirror 10 as shown in FIG. 2. A second edge of the mirror is located 66.00 mm from the optical axis of the mirror. The sag, Z, of the curved elliptical cylindrical surface is given by the following equation:

$$\frac{(CURV)Y^2}{1+(1-(1+K)(CURV)^2Y^2)^{1/2}}$$

where:

CURV=0.00374385 mm$^{-1}$

K=0.9534

Y=distance from the vertex surface

TABLE I

RADIUS OF BEST CYLINDER = 271.050

| Y | S1 SAG | BEST FIT CYL SAG | SAG DIFF. |
|---|---|---|---|
| 8.000000 | 0.119804 | 0.118085 | 0.000000 |
| 12.640000 | 0.299084 | 0.294884 | −0.002481 |
| 17.280000 | 0.558981 | 0.551379 | −0.005883 |
| 21.920000 | 0.899505 | 0.887797 | −0.009989 |
| 26.560000 | 1.320671 | 1.304438 | −0.014514 |
| 31.200000 | 1.822496 | 1.801672 | −0.019105 |
| 35.840000 | 2.405003 | 2.379949 | −0.023334 |
| 40.480000 | 3.068215 | 3.039793 | −0.026702 |
| 45.120000 | 3.812160 | 3.781807 | −0.028633 |
| 49.760000 | 4.636870 | 4.606679 | −0.028472 |
| 54.400000 | 5.542381 | 5.515180 | −0.025482 |

TABLE I-continued

RADIUS OF BEST CYLINDER = 271.050

| Y | S1 SAG | BEST FIT CYL SAG | SAG DIFF. |
|---|---|---|---|
| 59.040000 | 6.528729 | 6.508172 | −0.018838 |
| 63.680000 | 7.595958 | 7.586611 | −0.007629 |
| 66.000000 | 8.159917 | 8.158198 | 0.000000 |

Table I shows the sag of the curved surface at 14 equal spaced distances from the vertex. The table also shows the sag of the best fit cylindrical surface corresponding to the surface S2. The design of this optical arrangement was calculated using the well known Code 5 optical software available from Optical Research Associates with offices in Pasadena, Calif.

Figure 3A:
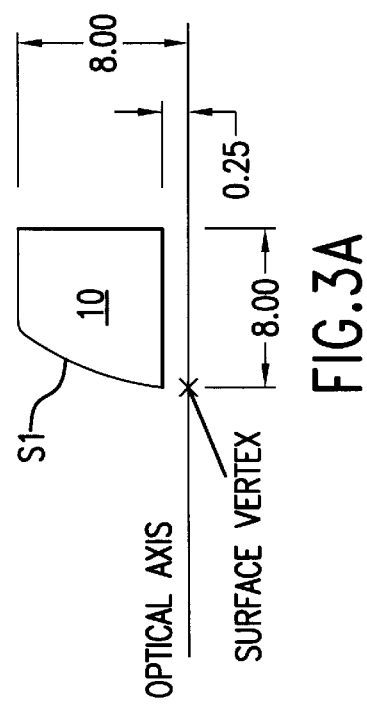

The two mirrors are aligned as shown in FIG. 2 with a common optical axis 14. The edge of mirror 10 closest to the optical axis is 0.25 mm from the optical axis and the edge farthest away from the optical axis is 8.0 mm from the optical axis as shown in FIG. 3A. The edge of mirror 12 closest to the optical axis is 8 mm from the optical axis and the edge farthest from the optical axis is 66 mm from the optical axis as shown in FIG. 4A. The vertex of mirror 12 is located 127 mm from the vertex of mirror 10 as shown in FIG. 2. The laser chamber 4 and aperture 8 are arranged so that the center of the 2.2 mm wide laser beam 16 is aligned parallel to optical axis 14 and 4 mm from it so that the center of the beam is positioned approximately at the center of the curved surface of mirror 10.

The rays of the beam from mirror 10 reflecting from mirror 12 will be directed in a direction parallel to beam 16 but the width of the expanded beam has been expanded from 2.2 mm about 21 times to about 46 mm.

Echelle grating 18 which is arranged in a Littrow configuration has an active length of 250 mm and is positioned as shown in FIG. 2 to reflect from its active length the expanded beam from mirror 12. The grating is a prior art eschelle grating having 82 lines per ml and is designed to reflect a very narrow spectral band of light directly back on itself. Light outside this very narrow spectral band is reflected in different directions and nearly all of this out of band light does not pass back through aperture 8 so it does not thereafter contribute to the laser beam and is not amplified as is the light which does pass back through aperture 8. A portion of the beam such as 70 percent passes through output coupler 20 on each encounter with it and becomes a part of the output beam. About 30 percent of the light encountering output coupler 20 is reflected back through the laser chamber for further amplification and line narrowing. In a typical ArF laser, laser pulses are short and so that the maximum number of trips by a photon through the chamber is about 5 to 7.

Wavelength and Bandwidth Control

Figure 5:
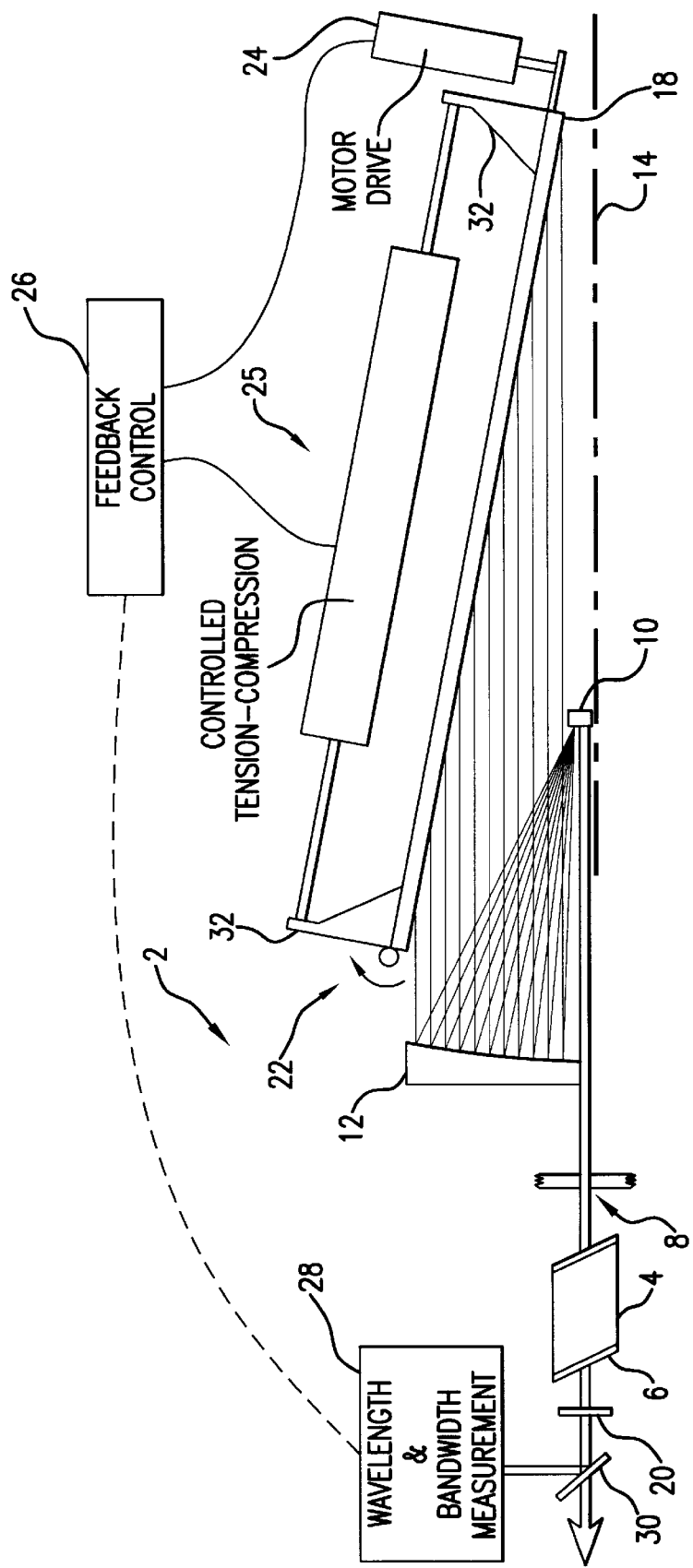
FIG. 5 shows a second preferred embodiment of the present invention.

FIG. 5 shows a preferred arrangement for controlling the wavelength and bandwidth of the laser. Eschelle grating 18 is pivotably mounted to pivot about pivot axle 22. The degree of pivot is controlled by motor drive 24 which in turn is controlled by feedback control processor 26 based on wavelength measurement signals from spectrographic instrument in wavelength and bandwidth measurement system 28. This system using any of several well known prior art techniques measures the wavelength and bandwidth of the output beam from a small portion of the beam reflected into the system from beam splitter 30.

The bandwidth can be minimized by very slightly adjusting the curvature of the lined surface of grating 18 with a curvature adjusting mechanism 25 as shown in FIG. 5 by applying tension or compression forces on legs 32 as directed by feedback control processor 26 based on measurements from system 28. The controlled tension-compression can be provided by any one of many available linear drive units commercially available.

Fabrication of Mirrors

Specifications for the mirror surfaces are preferably very tight. Surface accuracy should preferably be less than 1/20 of the wavelength of the laser beam. Mass production techniques are commercially available to produce surfaces as accurate as this. However, cylindrical aspheric surfaces such as mirror 12 are, more difficult to fabricate and are typically fabricated as a cylindrical mirror, then polished to the specified shape by precision and labor intensive hand polishing processes. However, automated production processes for these types of components are under development and expected to be available in the near future.

Alignment of the mirror surfaces is also very important. Tilts in the plane of: beam expansion should be less than $50\mu$ radians for the large mirror and the mirror positions should be accurate to 0.001 inch in order to keep wave front distortions to a small fraction of a wavelength. The mirror should preferably be fabricated from low expansion glass and coated with a coating appropriate for the wavelength of intended use.

Figure 6:
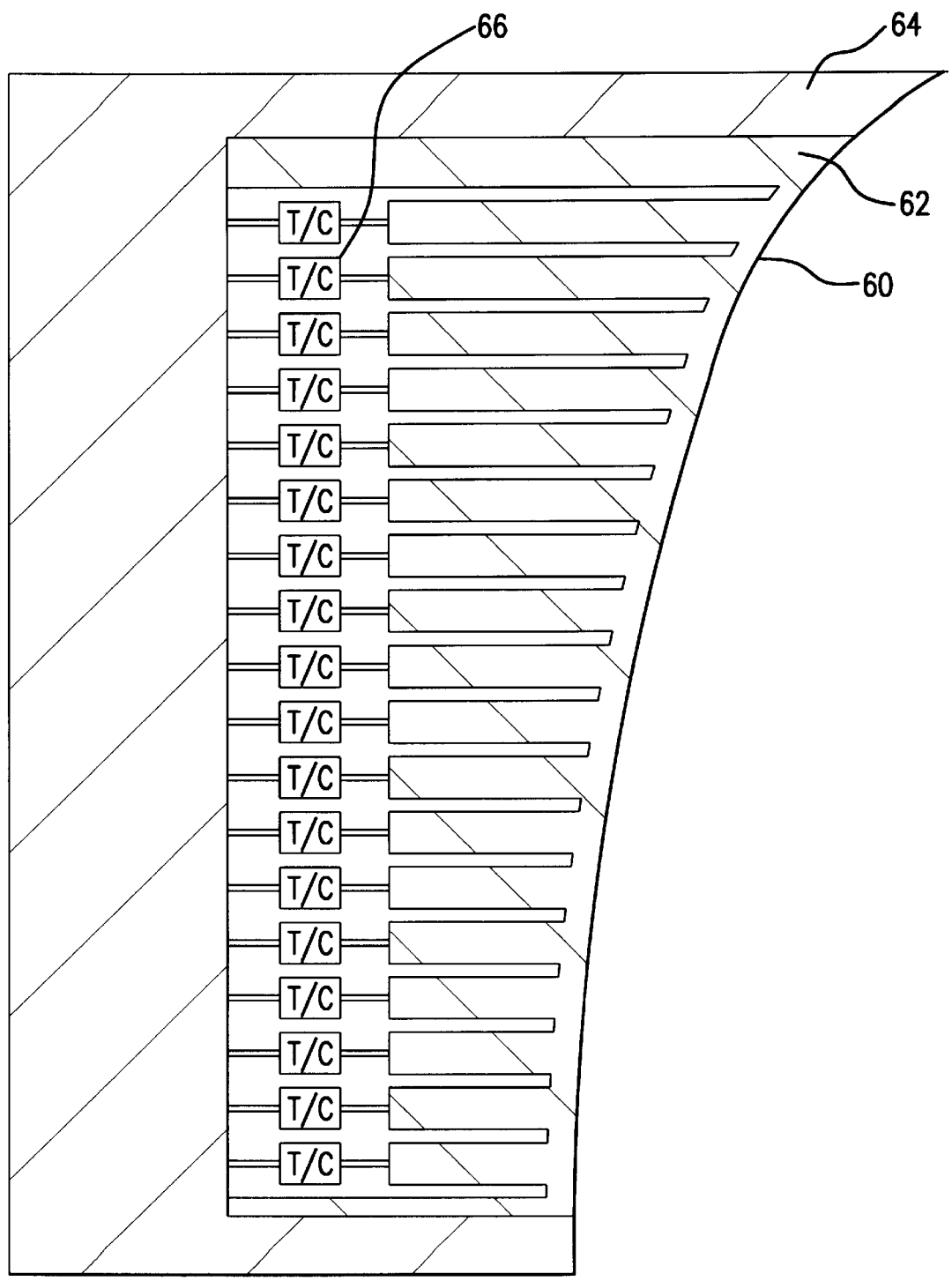
FIG. 6 shows a method converting a circular cylindrical mirror for use in an embodiment of the present invention.
Figure 7:
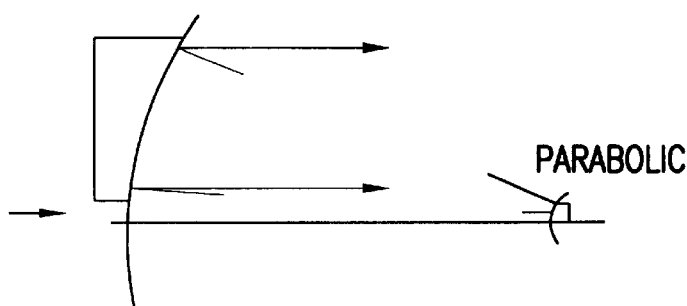
FIGS. 7, 8, 9 and 10 show other preferred arrangements of cylindrical mirrors for beam expansion.
Figure 8:
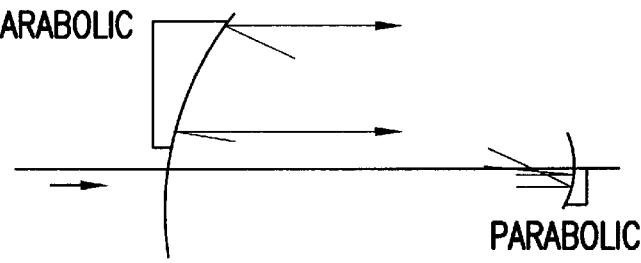
Figure 9:
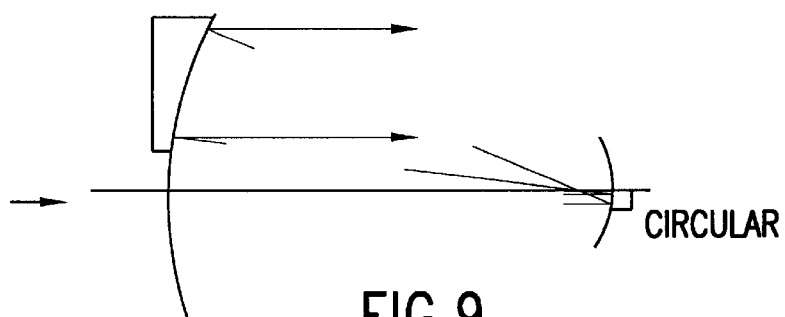
Figure 10:
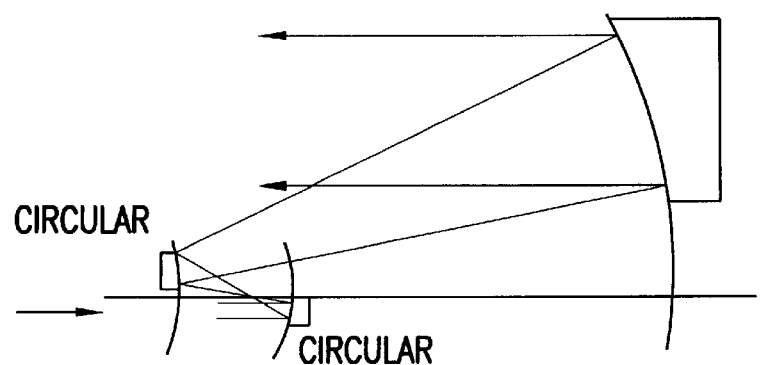

FIG. 6 discloses a technique for fabricating an elliptical cylindrical mirror such as that shown in FIGS. 2 and 5. A mirror material is machined into the general shape shown as 62 with a circular cylindrical surface 60 and is mounted in frame 64 with tension compression elements 66 mounted as shown. Surface 60 is then polished to a circular cylindrical surface to a very fine precision. Next, tension compression elements are adjusted to deform surface 60 into the elliptical cylindrical surface shown in FIGS. 2 and 5 and Table I and the corresponding equation provided above. Element 66 could be adjustment bolts for adjustment by hand or they could be electronically controlled devices such as piezoelectric drivers.

Advantages of Invention

The present invention virtually eliminates distortion due to optical absorption of the laser beam. This is very important when dealing with high power UV light because good material for prisms and lenses are not available and even the best available optical materials have some absorption.

The design shown in FIG. 2 is compact, has a relatively short optical path length comparable to prior prism based line narrowing systems. The system with careful fabrication and alignment can provide beam expansion with less than 0.07 waves of distortion (RMS value) at 193 nm. Distortions in this range would be considered "diffraction limited".

Other Reflective Beam Expanders

Many other all reflective beam expansion systems are possible for expanding ultraviolet laser beams which will be obvious to persons skilled in the art once they have read the foregoing. Four of these possible arrangements are shown in FIGS. 7, 8, 9 and 10. Many other beam cross sections may be chosen. The size of the aperture in the beam expansion direction is very important and should be chosen carefully recognizing the obvious trade off of beam energy vs. band width. The size of the aperture in the other direction is not nearly as critical.

Another preferred embodiment is an arrangement similar to that shown in FIG. 5 except mirror 12 is a circular cylindrical mirror and grating 18 is deformed to correct for the wavefront distortion produced by the two mirrors. The grating could be deformed as shown in FIG. 5 or the curvature adjusting mechanism could be more elaborate such as shown in FIG. 6. As described above with respect to the mirror shown in FIG. 6, the adjustment could be by hand using bolt type threaded devices or active electronic adjustment could be provided using an array of electronic drives which could be controlled in a feedback loop to adjust the curvature on a substantially real time basis.

The reader should note that magnifications greater than the 21× magnification of the first embodiment will require more precise control of surface accuracy. This will make fabrication of the optical devices more difficult.

The present invention will be useful to narrow band ArF lasers at wavelengths of about 193 nm. The invention will also be useful to line narrow $F_2$ lasers operating at 157 nm if the $F_2$ lasers become commercially available for use in lithography.

Many other reflective beam expansion configurations are possible other than the specific embodiment shown and many changes may be made to the specific embodiments shown without departing from the true spirit of the invention. Thus, the scope of the invention is to be determined by the appended claims and their legal equivalents.

What is claimed is:

1. A line narrowed ultraviolet laser comprising:
   A) a lasing medium
   B) a resonant cavity to generate lasing in said laser medium, said cavity comprising:
      1) an output coupler
      2) a line narrowing system comprising:
         a) an all reflective beam expander and
         b) a grating.

2. A laser as in claim 1 wherein said all reflective beam expander comprises at least two cylindrical mirrors.

3. A laser as in claim 2 wherein said at least two mirrors, one being a convex circular cylindrical mirror and the second mirror having a concave cylindrical surface slightly more concave than a completely concave cylindrical surface.

4. A laser as in claim 3 wherein said grating is an eschelle grating.

5. A laser as in claim 4 wherein said grating defines a surface curvature and comprises a curvature changing mechanism for changing said surface curvature.

6. A laser as in claim 5 and further comprising a feedback control for controlling said curvature changing mechanism.

7. A laser as in claim 4 wherein said grating is part of a grating mechanism comprising a pivot mechanism permitting said grating to pivot about a pivot axle.

8. A laser as in claim 7 and further comprising; a pivot adjusting mechanism for adjusting degrees of pivot about said pivot axle.

9. A laser as in claim 8 and further comprising a feedback control for controlling said pivot adjusting mechanism.

10. A laser as in claim 4 wherein said lasing medium comprises argon and fluorine gas and said laser is an ArF excimer laser.

11. A laser as in claim 4 wherein said lasing medium comprises krypton and fluorine and said laser is a KrF excimer laser.

12. A laser as in claim 4 wherein said lasing medium comprises fluorine and a buffer gas and said laser is a $F_2$ laser.

13. A laser as in claim 2 wherein said at least two mirrors comprise a first parabolic cylindrical mirror and a larger parabolic cylindrical mirror.

14. A laser as in claim 2 wherein said at least two mirrors comprise a first circular cylindrical mirror and a hyperbolic cylindrical mirror.

15. A laser as in claim 2 wherein said at least two cylindrical mirrors is three cylindrical mirrors: a first circular cylindrical mirror a second circular cylindrical mirror and an elliptical cylindrical mirror.

16. A line narrowed ultraviolet laser comprising:
    A) a lasing medium
    B) a resonant cavity to generate lasing in said laser medium, said laser cavity comprising:
       1) an output coupler
       2) a line narrowing system comprising:
          a) an all reflective beam expander comprising at least two cylindrical mirrors and
          b) a grating
    wherein at least one of said two cylindrical mirrors is a deformable mirror.

17. A laser as in claim 16 wherein said deformable mirror is a deformed concave circular mirror wherein deformation is provided adjustable tension compression elements.

18. A laser as in claim 16 wherein said deformable mirror is a deformed concave circular mirror wherein deformation is provided by adjustable compression elements.

* * * * *